United States Patent
Taniguchi

(10) Patent No.: US 7,599,503 B2
(45) Date of Patent: Oct. 6, 2009

(54) AUDIO OUTPUT LEVEL SETTING METHOD AND DEVICE

(75) Inventor: Tomohiko Taniguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/540,977

(22) PCT Filed: Dec. 17, 2004

(86) PCT No.: PCT/JP2004/019444

§ 371 (c)(1),
(2), (4) Date: Jun. 27, 2005

(87) PCT Pub. No.: WO2005/062663

PCT Pub. Date: Jul. 7, 2005

(65) Prior Publication Data

US 2006/0072769 A1 Apr. 6, 2006

(30) Foreign Application Priority Data

Dec. 19, 2003 (JP) ............................. 2003-422506

(51) Int. Cl.
 *H03G 3/00* (2006.01)
 *H03G 7/00* (2006.01)
 *H03G 9/00* (2006.01)
 *H04N 5/60* (2006.01)
(52) U.S. Cl. .................. 381/104; 381/105; 381/106; 381/109; 381/107; 381/102; 348/738
(58) Field of Classification Search ......... 381/102–109; 348/738
See application file for complete search history.

(56) References Cited

U.S. PATENT DOCUMENTS

| | | | | |
|---|---|---|---|---|
| 5,566,237 A | * | 10/1996 | Dobbs et al. ................ | 381/103 |
| 7,110,558 B1 | * | 9/2006 | Elliott ........................ | 381/105 |
| 7,343,566 B1 | * | 3/2008 | Chaudhri et al. ............ | 715/781 |
| 2005/0125088 A1 | * | 6/2005 | Bowden et al. .............. | 700/94 |

FOREIGN PATENT DOCUMENTS

| | | |
|---|---|---|
| JP | 8-097654 | 4/1996 |
| JP | 9-130173 | 5/1997 |
| JP | 10-294990 | 11/1998 |
| JP | 11-265190 | 9/1999 |
| JP | 2000-151314 | 5/2000 |
| JP | 2002-151986 | 5/2002 |
| JP | 2003-348682 | 12/2003 |

* cited by examiner

*Primary Examiner*—Devona E Faulk
(74) *Attorney, Agent, or Firm*—Wenderoth, Lind & Ponack L.L.P.

(57) ABSTRACT

In a device equipped with an audio output, a range of the audio output level in regular use is set. When an attempt is made to change the setting to a volume level exceeding the range of the audio output level having been set, a request is made for an acknowledgement that the operation is appropriate, and only if a reply is received within a given time, is the volume setting changed. Such a method prevents the audio output from a television set or audio equipment to be increased to a volume level higher than necessary due to an operating error in a volume setting operation.

16 Claims, 5 Drawing Sheets

AUDIO OUTPUT LEVEL SETTING METHOD AND DEVICE

This application is a U.S. national stage application of PCT international application PCT/JP2004/019444.

TECHNICAL FIELD

The present invention relates to a method of setting the audio output level for a device equipped with an audio output.

BACKGROUND ART

Currently, setting of the audio output level for a device equipped with an audio output, such as a television set or audio equipment, is generally made through remote control with a remote control unit, as well as through setting with the main unit of the device. Therefore, the main unit and remote control unit each have up/down buttons for the volume level, where these volume change buttons are operated as required when using a television set or audio equipment. A volume adjustment button is usually easy to operate because it is frequently used.

Meanwhile, a television set or audio equipment usually has a volume range from an adequately large volume, as compared to a volume in regular use, to silence. The maximum available volume of the device is not necessarily equal to a normal level in regular use.

Among conventional methods of setting the audio output level, a method of automatically adjusting the volume level according to ambient circumstances is disclosed in Japanese Patent Unexamined Publication No. H08-97654 (hereinafter, referred to as "patent literature 1"). Further, a method in which minimum and maximum input levels are preliminarily set when amplifying audio signals with a variable gain amplifier is disclosed in Japanese Patent Unexamined Publication No. H10-294990 (hereinafter, referred to as "patent literature 2").

As mentioned above, the operation of changing the volume setting for a television set or audio equipment is desirably easy because the operation is frequently performed. This may cause the volume level to increase more than necessary if the operable part is accidentally touched or if an infant innocently changes the volume level.

Even if the volume level is automatically changed according to ambient circumstances as in the invention described in patent literature 1, the above-mentioned problems cannot be solved because the basic audio level is set by the user.

Meanwhile, a maximum output volume may be restricted as in the invention described in patent literature 2, which poses an obstacle because a required volume level may not be available in some operation environments.

Further, in a television set or audio equipment, turning on the power again after turning off the power with the volume level at a high setting causes too large a sound to burst out from the device because the previous audio output level is retained.

Another problem is, if the audio output level has been changed while the device is controlled to be in a silent state, ending the silent state unexpectedly causes too large a sound to burst out from the device.

SUMMARY OF THE INVENTION

In order to solve these problems, with a method of setting the audio output level for a device equipped with an audio output, according to the present invention, a range of the audio output level in regular use is set as a threshold. If an operation is performed to set the audio output level to exceed the range of the audio output level having been set, a request is made for an acknowledgment that the operation of changing the audio output level is appropriate; and only if a reply is given, is the setting changed.

Further, a method of setting the audio output level according to the present invention is characterized in that the initial audio output level is automatically changed when the device is next used, if the audio output level has been set when previously used to exceed the range of the audio output level in regular use.

Still, in a method of setting the audio output level according to the present invention, in a device that receives signals including audio information and performs audio output according to the received signals, the reception state of the receive signals is checked. If the operation of changing the audio output level setting is made during a silent period according to the reception state, the audio output level setting is not changed, but notice that the audio output level setting is not to be changed is given. Alternatively, a request is made for an acknowledgment that the audio output level setting is to be changed, and only if such an acknowledgment is given, is the setting changed.

With the above-mentioned method, requesting the operator for an acknowledgment that the operation of changing the volume level currently being performed is one intended by the operator solves the problem in which an operating error causes audio output larger than necessary. Meanwhile, if the audio output level exceeding the range of the audio output level in regular use is selected for some reason, the problem is solved in which the retained audio output level setting causes audio output larger than necessary when the device is used again or the audio output is resumed.

DETAILED DESCRIPTION OF PREFERRED EMBODIMENTS

A description is provided for a method of setting the audio output level according to exemplary embodiments of the present invention, using drawings.

First Exemplary Embodiment

First, a description is provided for an example makeup of devices realizing the method of setting the audio output level according to the present invention. Here, in this application, the audio output level is assumed to refer to the degree of volume amplification output from an actual speaker or the like for audio signals.

Figure 1:
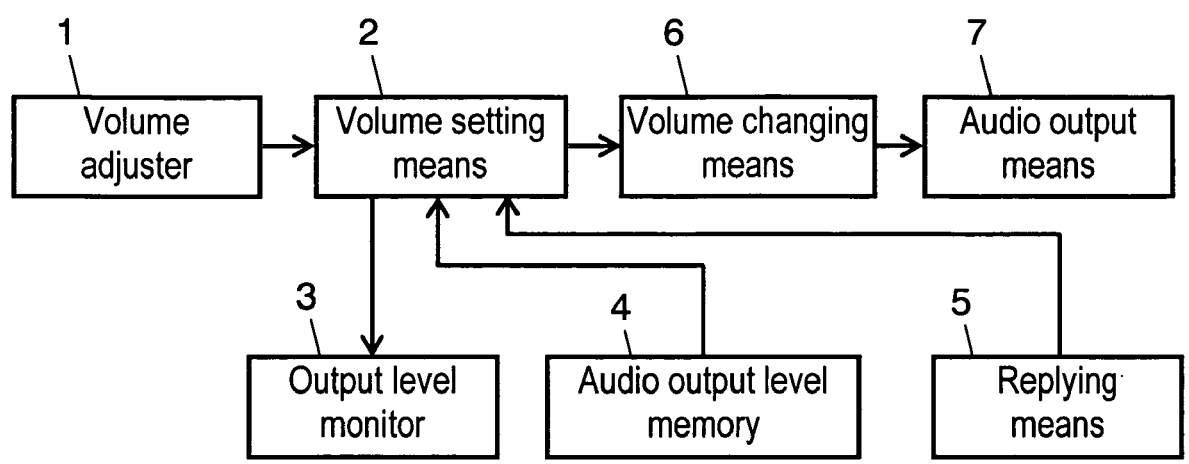
FIG. 1 is a block diagram showing the makeup of a device for setting the audio output level according to the first exemplary embodiment of the present invention.

FIG. 1 is a block diagram showing an example makeup according to the exemplary embodiment of the present invention. In FIG. 1, the device for setting the audio output level according to the present invention has volume adjuster 1, volume setting means 2, output level monitor 3, audio output level memory 4, replying means 5, volume changing means 6, and audio output means 7.

Here, audio output level memory 4 stores a threshold in setting a range of the audio output level, where the threshold is preliminarily set by the user. Hereinafter, a description is provided for a case where an upper limit of the audio output level is set as this threshold.

Volume adjuster 1, used for inputting a volume adjusting command, corresponds to a volume change button on the remote control unit, or a button or knob for setting the volume level provided on the main unit. Volume adjuster 1 gives notice to volume setting means 2 that a request has been made for changing the audio output level setting (raise or lower the volume level).

Volume setting means 2 receives from volume adjuster 1 a request for changing the audio output level setting. Volume setting means 2 then gives notice to volume changing means 6 of changing the audio output level, if the request made from the volume adjuster 1 is for lowering the volume level, or if the changed audio output level is lower than the upper limit of the audio output level that has been preliminarily set. Next, volume setting means 2 gives notice of changing the audio output level to volume changing means 6, if an acknowledgement is given by replying means 5 that the change is appropriate.

Meanwhile, if the request for volume setting made from the volume adjuster 1 is for raising the volume level, volume setting means 2 judges whether the changed audio output level exceeds the upper limit of the audio output level preliminarily set. This upper limit of the audio output level, stored in audio output level memory 4, may be changeable according to an operator's instruction, or may be a fixed value preliminarily set.

If the changed audio output level exceeds the upper limit of the audio output level preliminarily set, volume setting means 2 then gives notice to output level monitor 3 that a request has been made for changing to the audio output level to exceed the upper limit.

Output level monitor 3 gives notice to the operator who has made the volume adjustment that the audio output level is to exceed the upper limit preliminarily set after the audio output level setting is changed. The notice can be given with characters on the screen of a device provided with a display unit such as a television set, and/or with sound.

Replying means 5 receives a reply from the operator that the volume adjustment is appropriate, when the output level monitor requests the operator for an acknowledgement that the audio output level setting is appropriate. Replying means 5 corresponds to a button provided on the remote control unit or main unit, in the same way as volume adjuster 1. Here, separately providing a reply button may be avoided by adding the function of a reply button to another operation button. In this case, the relevant operation button is usually used for selecting its original function individually allocated. However, the button works as a reply button for output level monitor 3 for a certain period of time immediately after a request for an acknowledgement is made by output level monitor 3. A certain period of time may be 3 seconds, for example. Here, if a reply is given to replying means 5, output level monitor 3 may give notice again to the operator that the setting of the audio output level has been enabled, to encourage the operator to change the audio output level.

Volume changing means 6 changes the audio output level according to an instruction for changing the audio output level setting given by volume setting means 2. Changing the audio output level is feasible with an electronic volume control device, for example.

Audio output means 7 outputs audio signals with their audio output level set by volume changing means 6.

Figure 2:
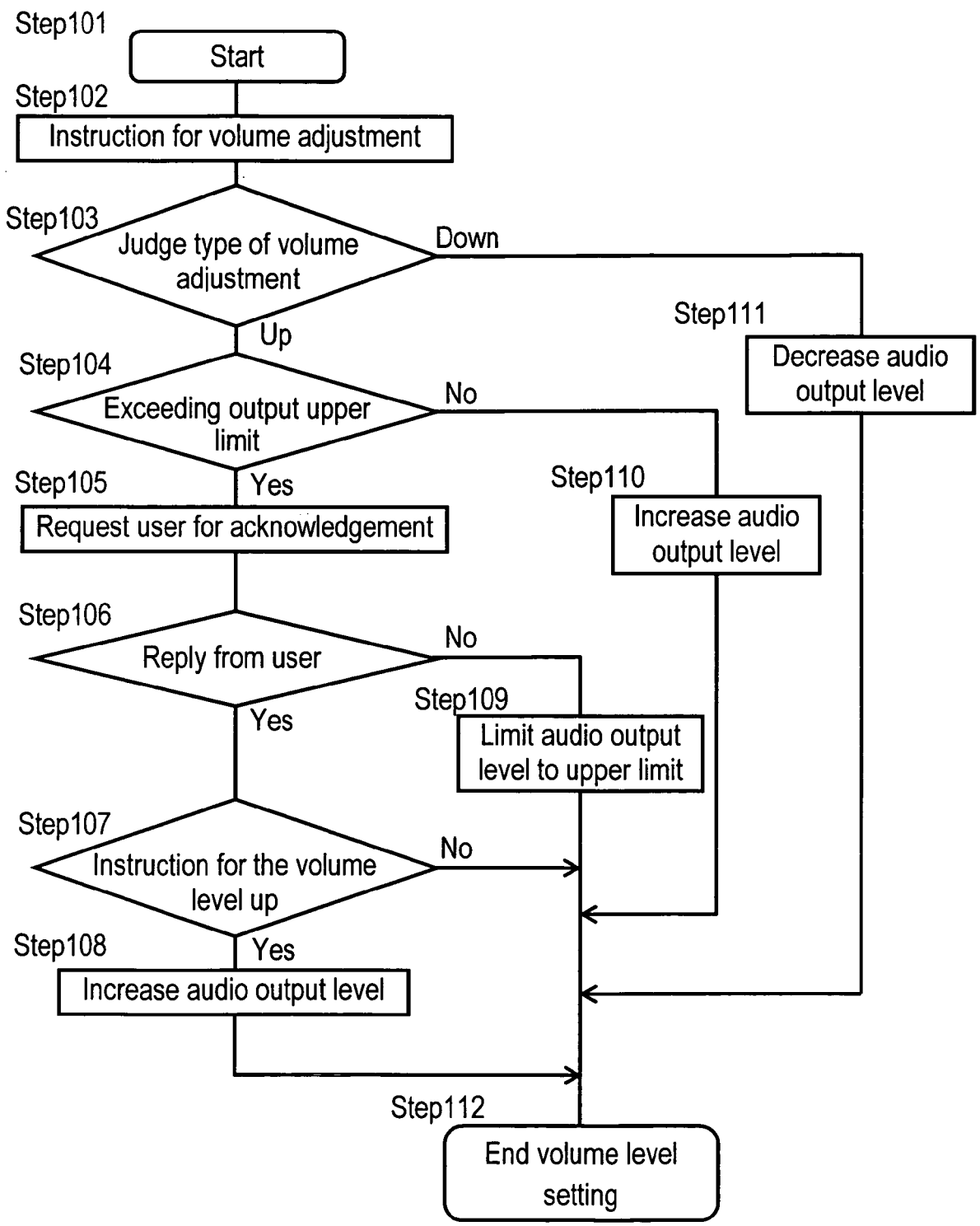
FIG. 2 is a flowchart showing a method of setting the audio output level according to the first exemplary embodiment of the present invention.

Next, a description is provided for the detailed processing procedure by volume setting means 2, using the flowchart in FIG. 2.

First, the process accepts an instruction for volume adjustment from volume adjuster 1 (step 102). Next, the process distinguishes the type of instruction for volume adjustment (step 103).

If the instruction is for raising the volume level, the process judges whether or not the volume level set by the instruction for volume adjustment exceeds the upper limit of the audio output level preliminarily set (step 104). Meanwhile, if the instruction is for lowering the volume level, the process decreases the audio output level and then ends the volume adjustment (steps 111 and 112). In step 104, if the audio output level set with the instruction for volume adjustment does not exceed the upper limit, the process increases the audio output level and then ends the volume adjustment (steps 110 and 112).

In step 104, in case the audio output level set with the instruction for volume adjustment exceeds the upper limit, the process requests the operator for an acknowledgement that the operation is appropriate (step 105).

When a reply is given from the operator within a certain period of time, the process increases the audio output level according to a subsequent instruction for raising the volume level, and then ends the volume adjustment (steps 106, 107, 108, and 112).

In step 106, if a reply is not given from the operator within a certain period of time, the process sets the audio output level to the upper limit and then ends the volume adjustment (steps 109 and 112). As a replying means from the operator, another operating means on the device can instead be used within a certain period of time after the request for an acknowledgement, not necessarily requiring a separate operating means.

In the above-mentioned makeup, the description is made for a method of setting the audio output level using one threshold. However, plural thresholds can be set and stored. For example, the upper limit of the audio output level may be separately set according to a time frame in using the device. As an example, two different thresholds for daytime and nighttime are to be set, where the upper limit for daytime is to be different from that for nighttime.

This case is acceptable as long as the thresholds are set and stored in association with clock time information for using these thresholds. As a result, comparing the current clock time information obtained from built-in clock means, with the stored clock time information, allows the audio output level to be controlled using the threshold having been set for the present time. Daytime may be set as from 6:00 a.m. to 8:00 p.m. and nighttime from 8:00 p.m. to 6:00 a.m., for example, thus enabling fine-tuned control of the audio output level according to the user's life pattern, such as a relatively large threshold for daytime and a small threshold for nighttime.

Naturally, setting three or more thresholds and more minute clock time information to be associated therewith allows for further finer-tuned control of the audio output level.

The upper limit of the audio output level may be changeable according to a connected device. For different signal levels by device, such as audio equipment with various devices connected, the upper limit of the audio output level may be separately set for each device.

This case is acceptable as long as the thresholds are set and stored in association with the information for the audio output devices using these thresholds. As a result, comparing the information about which audio output device is currently outputting with its ID number, which is allocated for identifying the device, assuming that the target equipment using the present invention incorporates plural audio output devices such as a CD player and radio receiver, allows the audio output level to be controlled using the optimum threshold for the device.

Allocating a relevant ID number also to the audio input terminal allows the audio output level to be controlled as well, even if an external audio output device is connected.

In the above description, the upper limit of the audio output level is to be preliminarily set. However, the lower limit can be preliminarily set as well. In this case, if the setting is made so that the audio output level is lower than the lower limit when decreasing the volume level, it is acceptable as long as a request is made to the operator for an acknowledgement that the operation is appropriate, and if a reply is given, the setting is made so that the value is lower than the lower limit.

As described above, the method of setting the audio output level and the device for setting the audio output level according to the present invention prevent an error in setting the audio output level due to an operating error, by making a request for an acknowledgement that the volume adjustment currently intended is appropriate.

Second Exemplary Embodiment

Figure 3:
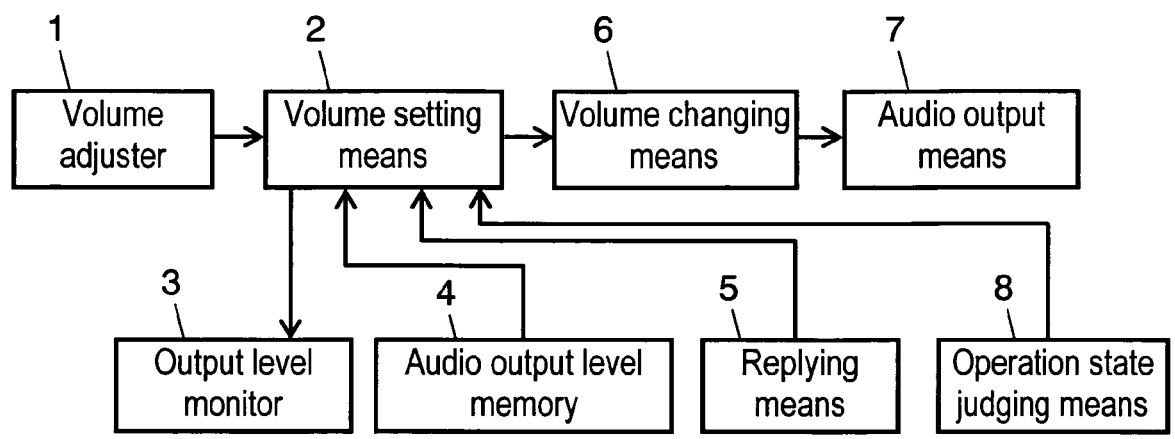
FIG. 3 is a block diagram showing the makeup of a device for setting the audio output level according to the second exemplary embodiment of the present invention.

A description is provided for a method of setting the audio output level according to a second exemplary embodiment of the present invention, using FIG. 3. FIG. 3 shows operation state judging means 8 newly added to FIG. 1. Accordingly, the detailed description is omitted for the parts with the same makeup as that in FIG. 1.

The second exemplary embodiment is different from the first one in that signals from operation state judging means 8 are connected to volume setting means 2. In the first exemplary embodiment, the setting of the volume output by the device is made according to an operation instruction from volume adjuster 1.

Meanwhile, in the second exemplary embodiment, the volume level is set according to instructions from operation state judging means 8, in addition to those from volume adjuster 1.

In FIG. 3, operation state judging means 8 gives notice to volume setting means 2 that it is immediately after the power is turned on. A description is made for the actions of volume setting means 2 using the flowchart in FIG. 4.

Volume setting means 2 identifies a state immediately after the power is turned on, by detecting signals from operation state judging means 8 (step 202).

Volume setting means 2 checks the audio output level setting when the power is turned on, and ends setting of the audio output level if it is lower than the upper limit of the audio output level preliminarily set (steps 203 and 205).

Meanwhile, volume setting means 2 changes the audio output level, and then ends setting of the audio output level if it exceeds the upper limit thereof preliminarily set (steps 203, 204, and 205).

The changed audio output level may be the upper limit of the audio output level or a separate one preliminarily set.

When audio signals to be output are selected from among plural kinds, the output level can be separately set by kind of signals at a connection source. Here, plural kinds of audio signals refer to audio signals such as those from a radio receiver and compact disc player, for audio equipment; and those from satellite and terrestrial broadcasting, and from video equipment, for television.

Meanwhile, in the above description, operation state judging means 8 is to give notice to volume setting means 2 that it is immediately after the power is turned on. However, operation state judging means 8 may give notice to volume setting means 2 that the power has been turned on only when the power is cycled after a certain period of time. Here, a certain period of time is to be 15 to 30 minutes or longer, for example. This makeup prevents the volume level setting that has been recently set from being changed if the power is frequently cycled by dispensing with resetting of the volume level every time the power is turned on, despite a slight change in operation environment of the device.

As a concrete example for operation state judging means 8, the case is shown where judgement is made that it is immediately after the power is turned on. However, besides detecting a state in which the power is turned on and off, detecting may be made that no operation has been performed for a certain period of time. Alternatively, judgement may be performed as to whether the elapsed time from the last audio output to the new one exceeds a certain period of time. This makeup may be applied to a cell phone, for example, where continuous audio output is not necessarily made while the power is on.

Here, a telephone call on a cell phone is taken as an example. When the audio signal output level is set so as to exceed the upper limit of the audio output level preliminarily set, for some reason in the previous telephone call, the audio signal level may be reset to the audio output level preliminarily set in the next call. This prevents sound with a volume level higher than necessary from being unexpectedly output in an environment for the next call, due to a change from the previous call in ambient environment.

Hereinbefore, the description has mainly been related to the case where the audio output level is increased. However, it is obvious that the same method can be applied for the case where the audio output level is decreased, inversely.

When upper and lower limits of the audio output level are set to be suitable for an ordinary environment, and if the audio output level exceeds the upper or lower limit, the method in the description hereinbefore can be applied.

In this exemplary embodiment, setting and storing plural thresholds with information about time and the audio output device to be associated therewith, allow for further finer-tuned control of the audio output level.

Third Exemplary Embodiment

Figure 5:
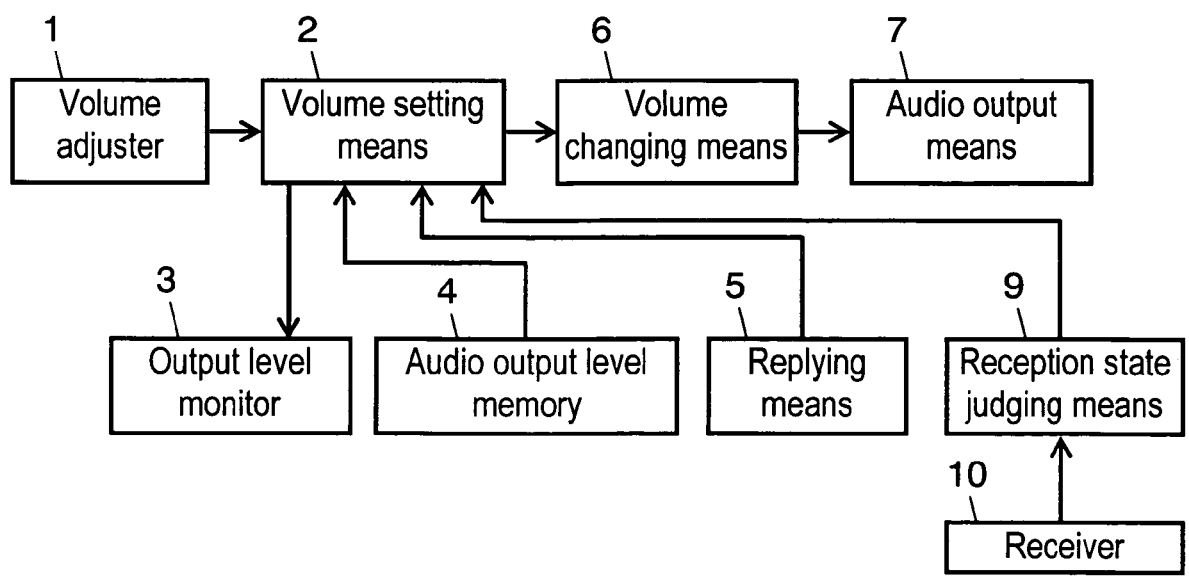
FIG. 5 is a block diagram showing the makeup of a device for setting the audio output level according to the third exemplary embodiment of the present invention.

A description is provided for a method of setting the audio output level according to a third exemplary embodiment of the present invention, using FIG. 5. FIG. 5 shows reception state judging means 9 and receiver 10 newly added to FIG. 1. Accordingly, the detailed description is omitted for the parts with the same makeup as that in FIG. 1.

The third exemplary embodiment is different from the first one in that signals from reception state judging means 9 are connected to volume setting means 2, and that signals from receiver 10 are connected to reception state judging means 9. In the first exemplary embodiment, the setting of the volume output by the device is made according to operation instructions from volume adjuster 1.

The third exemplary embodiment relates to a method of setting the audio output level when a volume adjustment is made in a device equipped with an audio output function, such as a television set or audio equipment, particularly assuming that the audio output level is changed according to reception conditions in broadcasting. Accordingly, in the third exemplary embodiment, volume setting means 2 sets the volume level according to instructions from reception state judging means 9 in addition to those from volume adjuster 1. Reception state judging means 9 gives instructions to volume setting means 2 according to information from receiver 10.

Hereinafter, a description of this exemplary embodiment will be made for a case where TV broadcasting is being viewed on a mobile object such as an automobile. When receiving TV broadcasting on a mobile object, reception conditions largely change with its movement. Poor reception conditions cause interruption in sound and image. When receiving digital broadcasting in particular, interruption in sound and image occurs if the receive signal quality decreases below a certain level. In this case, control is usually performed such that an image having been received until immediately before the decrease is output as a still image and audio output is not made. Here, when receiving the conventional analog broadcasting, where degradation in sound and image gradually emerges according to degradation in received signal quality, viewers can recognize degradation in reception quality relatively easily.

As mentioned above, when receiving digital broadcasting, a still image and silence may mislead a viewer into believing that the silence is caused by the low audio output level and into trying to increase the volume level.

Figure 4:
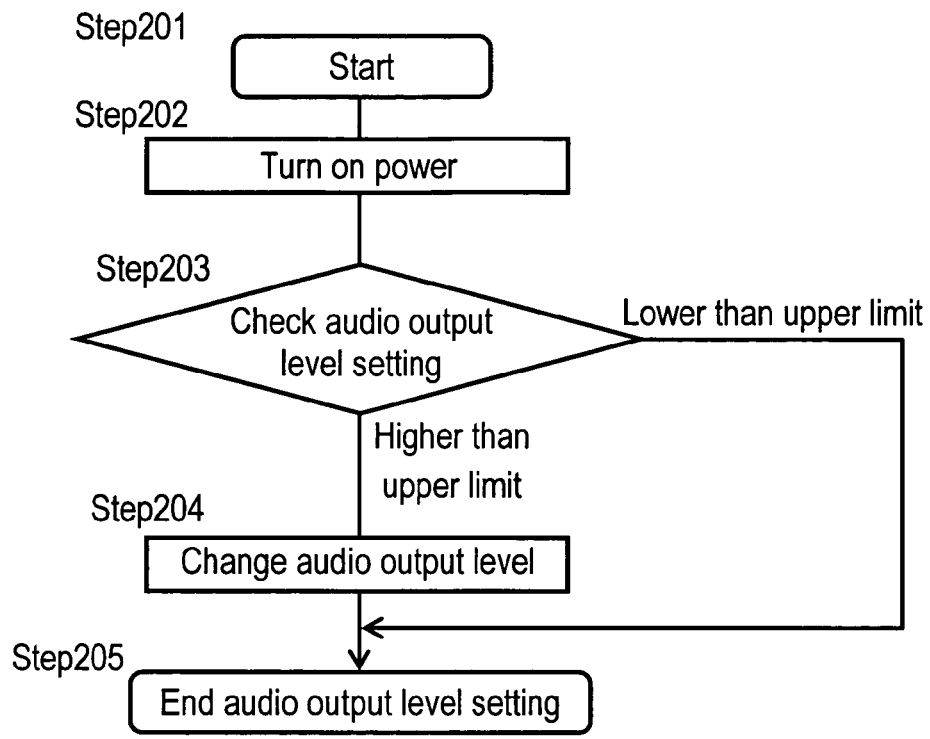
FIG. 4 is a flowchart showing a method of setting the audio output level according to the second exemplary embodiment of the present invention.

Under these circumstances, receiver 10 shown in FIG. 4 gives notice of the reception state of broadcasting to reception state judging means 9. Reception state judging means 9 detects signals from receiver 10 and then gives notice of the reception state to volume setting means 2.

Figure 6:
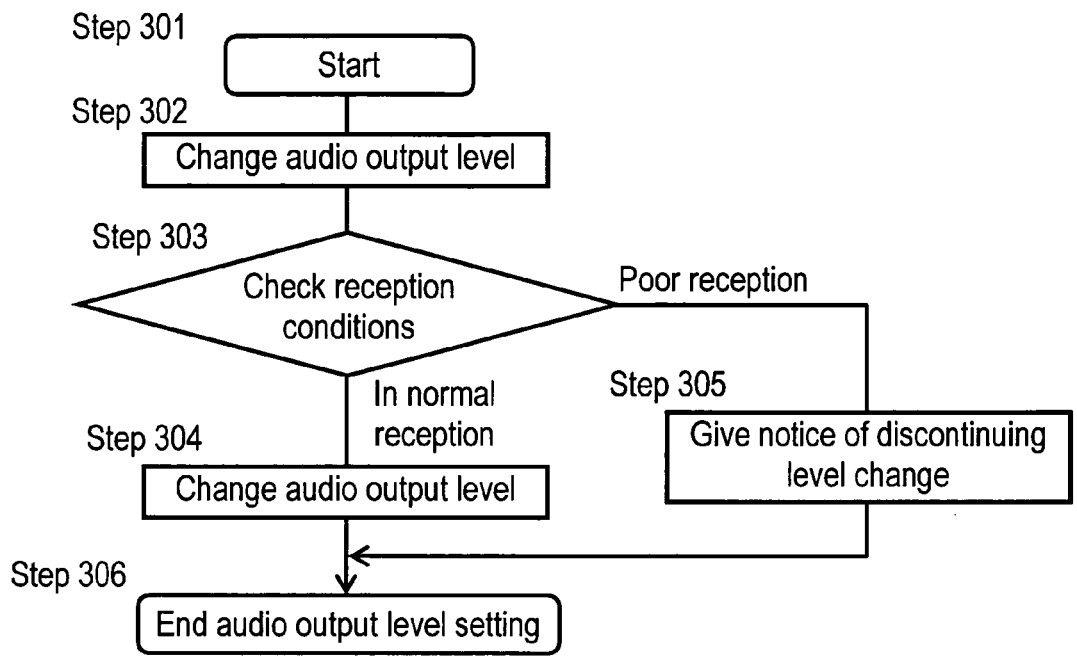
FIG. 6 is a flowchart showing a method of setting the audio output level according to the third exemplary embodiment of the present invention.

A description is provided for the actions of volume setting means 2, using FIG. 6. Volume setting means 2 detects that a request has been made for changing the audio output level (step 302). Volume setting means 2 detects signals from reception state judging means 9 to check the current reception conditions (step 303). If the broadcast is being normally received, the process changes the audio output level (step 304), and then ends setting of the audio output level (step 306).

Meanwhile, if the broadcast is not being normally received, the process gives notice that the audio output level will not be changed (step 305), and then ends setting of the audio output level (step 306).

Here, the notice that the audio output level will not be changed may be given with characters on the screen of a display unit or with sound.

This method solves the following problem. That is, if the audio output level has been changed while the device is controlled to be in a silent state, ending the silent state causes too large a sound to burst out from the device.

Figure 7:
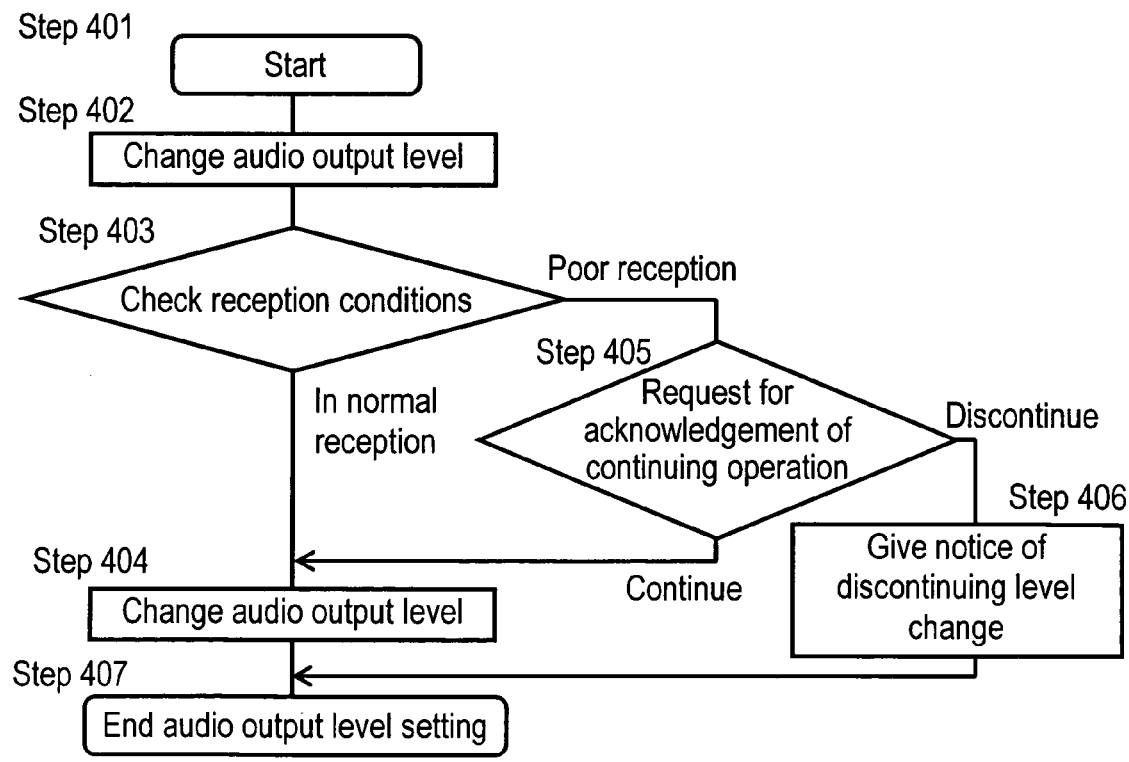
FIG. 7 is another flowchart showing a method of setting the audio output level according to the third exemplary embodiment of the present invention.

The actions of volume setting means 2 can also be the processes in FIG. 7. Volume setting means 2 detects a request for changing the audio output level having been made (step 402). Volume setting means 2 detects signals from reception state judging means 9 to check the current reception conditions (step 403). If the broadcast is normally being received, the process changes the audio output level (step 404), and then ends setting of the audio output level (step 407).

Meanwhile, if the broadcast is not normally being received, the process makes a request for an acknowledgement that the operation for changing the audio output level is appropriate (step 405), and if the operator selects continuing of the change operation, the process changes the audio output level (step 404), and then ends setting of the audio output level (step 407).

Meanwhile, in step 405, if the operator does not select continuing of the change operation, the process gives notice of the discontinuing of the level change (step 406), and then ends setting of the audio output level (step 407).

The method of giving notice that the audio output level will not be changed is to be the same as that in FIG. 6. The notice of discontinuing the change of the audio output level in step 406 can be omitted.

The above method solves the following problem. That is, if the audio output level has been changed while the device is controlled to be in a silent state, ending the silent state unexpectedly causes too large a sound to burst out from the device.

Here, the description is made for the case where digital TV broadcasting is received on a mobile object as the third exemplary embodiment. However, this exemplary embodiment can be applied to another type of usage. Further, the first exemplary embodiment can be combined with the second one.

INDUSTRIAL APPLICABILITY

A method of setting the audio output level and a device for setting the audio output level of the present invention eliminate an error in setting the audio output level due to an operating error, and prevent sound with an inappropriate volume level from being output when the device is subsequently used or when the reception state improves, which is useful for devices with an audio output function, in general.

The invention claimed is:

1. A method of setting an audio output level comprising:
   storing a plurality of thresholds associated with clock time information preliminarily;
   selecting one of the plurality of thresholds corresponding to a current clock time;
   requesting an acknowledgement that a setting of the audio output level is to be changed, if the setting of the audio output level is to be changed to a setting that exceeds the selected threshold;
   allocating a function of replying to the acknowledgement to an operation button provided on at least one of a remote control unit and a main unit for a certain period of time immediately after requesting the acknowledgment;
   setting, in a setting unit, the audio output level to the setting that exceeds the selected threshold, if the reply via the operation button is received; and
   setting, in the setting unit, the audio output level to the selected threshold, if a reply via the operation button is not received by expiration of the certain time period.

2. A method of setting an audio output level comprising:
   storing a plurality of thresholds associated with audio output device information preliminarily;
   selecting one of the plurality of thresholds corresponding to a currently connected audio output device;

requesting an acknowledgement that a setting of the audio output level is to be changed, if the setting of the audio output level is to be changed to a setting that exceeds the selected threshold;

allocating a function of replying to the acknowledgement to an operation button provided on at least one of a remote control unit and a main unit for a certain period of time immediately after requesting the acknowledgment;

setting, in a setting unit, the audio output level to the setting that exceeds the selected threshold, if the reply via the operation button is received; and setting, in the setting unit, the audio output level to the selected threshold, if a reply via the operation button is not received by expiration of the certain time period.

3. The method of setting an audio output level as recited in claim 1, wherein each of the plurality of thresholds includes at least one of an upper limit and a lower limit.

4. A device for setting an audio output level, the device comprising:

a storage unit operable to store a plurality of thresholds associated with clock time information preliminarily;

a selecting unit operable to select one of the plurality of thresholds corresponding to a current clock time;

a requesting unit operable to request an acknowledgement that a setting of the audio output level is to be changed, if the setting of the audio output level is to be changed to a setting that exceeds the selected threshold;

an allocating unit operable to allocate a function of replying to the acknowledgement to an operation button provided on at least one of a remote control unit and a main unit for a certain period of time immediately after requesting the acknowledgement; and a setting unit operable to set the audio output level to the setting that exceeds the selected threshold, if the reply via the operation button is received, and set the audio output level to the selected threshold, if a reply via the operation button is not received by expiration of the certain time period.

5. The device for setting an audio output level as recited in claim 4, further comprising:

a changing unit operable to change the setting of the audio output level only if the acknowledgement is given that the setting is to be changed.

6. A device for setting an audio output level, the device comprising:

a storage unit operable to store a plurality of thresholds associated with audio output device information preliminarily;

a selecting unit operable to select one of the plurality of thresholds corresponding to a currently connected audio output device;

a requesting unit operable to request an acknowledgement that a setting of the audio output level is to be changed, if the setting of the audio output level is to be changed to a setting that exceeds the selected threshold;

an allocating unit operable to allocate a function of replying to the acknowledgement to an operation button provided on at least one of a remote control unit and a main unit for a certain period of time immediately after requesting the acknowledgement; and a setting unit operable to set the audio output level to the setting that exceeds the selected threshold, if the reply via the operation button is received, and set the audio output level to the selected threshold, if a reply via the operation button is not received by expiration of the certain time period.

7. The device for setting an audio output level as recited in claim 6, further comprising:

a changing unit operable to change the setting of the audio output level if the acknowledgement is given that the setting is to be changed.

8. The method of setting an audio output level as recited in claim 1, further comprising:

changing the setting of the audio output level only if the acknowledgement is given that the setting is to be changed.

9. The method of setting an audio output level as in recited claim 1, further comprising:

changing the setting of the audio output level only if an acknowledgement is given that the setting is to be changed within a given time after the requesting of the acknowledgement.

10. The method of setting an audio output level as recited in claim 2, further comprising:

changing the setting of the audio output level only if the acknowledgement is given that the setting is to be changed.

11. The method of setting an audio output level as recited in claim 2, further comprising:

changing the setting of the audio output level only if an acknowledgement is given that the setting is to be changed within a given time after the requesting of the acknowledgement.

12. The method of setting an audio output level as recited in claim 2, wherein each of the plurality of thresholds includes at least one of an upper limit and a lower limit.

13. The method of setting an audio output level as recited in claim 1, further comprising:

ending the setting of the audio output level after the certain period of time expires, if the reply via the operation button is received.

14. The method of setting an audio output level as recited in claim 2, further comprising:

ending the setting of the audio output level after the certain period of time expires, if the reply via the operation button is received.

15. The device for setting an audio output level as recited in claim 4, wherein the setting unit ends the setting of the audio output level after the certain period of time expires, if the reply via the operation button is received.

16. The device for setting an audio output level as recited in claim 6, wherein the setting unit ends the setting of the audio output level after the certain period of time expires, if the reply via the operation button is received.

* * * * *